(12) United States Patent
Herceg

(10) Patent No.: US 12,260,215 B2
(45) Date of Patent: Mar. 25, 2025

(54) DETERMINING DISTANCES BETWEEN VECTORS

(71) Applicant: Nokia Technologies Oy, Espoo (FI)

(72) Inventor: Marijan Herceg, Osijek (HR)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 18/199,996

(22) Filed: May 22, 2023

(65) Prior Publication Data

US 2023/0385060 A1 Nov. 30, 2023

(30) Foreign Application Priority Data

May 24, 2022 (EP) ..................................... 22175024

(51) Int. Cl.
*G06F 9/30* (2018.01)

(52) U.S. Cl.
CPC ...... *G06F 9/30036* (2013.01); *G06F 9/30029* (2013.01)

(58) Field of Classification Search
None
See application file for complete search history.

(56) References Cited

U.S. PATENT DOCUMENTS

| | | | | |
|---|---|---|---|---|
| 7,852,652 B1 * | 12/2010 | Fabry | ...................... | G11C 15/04 365/49.1 |
| 2005/0187975 A1 * | 8/2005 | Yamane | ............... | G06F 16/3347 707/E17.08 |
| 2011/0216569 A1 * | 9/2011 | Akiyama | ............... | G11C 15/04 365/49.17 |
| 2012/0188811 A1 * | 7/2012 | Mattausch | ............. | G11C 15/04 365/49.17 |
| 2020/0089992 A1 | 3/2020 | Lawrence | | |
| 2021/0294780 A1 | 9/2021 | Lifsches | | |

OTHER PUBLICATIONS

Loh, C. et al., Pulse-Width Modulation of Z-Source Inverters, 2004, IEEE, pp. 148-155. (Year: 2004).*
Hamdi, M. et al., Space vector pulse width modulation of multilevel inverters: A new method for selecting the appropriate small hexagon, 2012, IEEE, pp. 774-779. (Year: 2012).*
Ikeda, M. et al., "Time-Domain Minimum-Distance Detector and Its Application to Low Power Coding Scheme on Chip Interface," Proceedings of the 24th European Solid-State Circuits Conference, The Hague, Netherlands, 1998, pp. 464-467.

* cited by examiner

*Primary Examiner* — Eric Coleman
(74) *Attorney, Agent, or Firm* — McCarter & English, LLP

(57) ABSTRACT

In-memory computing circuits can be used to determine distances between vectors. Such circuits can be used for machine learning applications. Examples include obtaining at least one dimension of a query vector wherein the dimension includes one or more bits and comparing respective bits of the dimension to corresponding bits of at least one dimension of a reference vector. This obtains a control signal dependent upon whether the bits of the dimension of the query vector are the same as corresponding bits of the dimension of the reference vector. The control signal can then be used to control a pulse modifying circuit such that a modification applied to a pulse signal is dependent upon whether the bits of the dimension of the query vector are the same as corresponding bits of the dimension of the reference vector.

20 Claims, 8 Drawing Sheets

DETERMINING DISTANCES BETWEEN VECTORS

TECHNOLOGICAL FIELD

Examples of the disclosure relate to determining distances between vectors. Some relate to determining distances between vectors for use in machine learning applications.

BACKGROUND

Distance measures between vectors such as Hamming distances and Manhattan distances are used in machine learning applications. Such distances can provide an indication of the relative differences between respective vectors.

BRIEF SUMMARY

According to various but not neceesarily all, examples of the disclosure there is provided an apparatus comprising means for:
obtaining at least one dimension of at least one query vector wherein the dimension comprises one or more bits;
comparing respective one or more bits of the at least one dimension of the at least one query vector to corresponding one or more bits of at least one dimension of at least one reference vector to obtain a control signal dependent upon whether the respective one or more bits of the at least one dimension of the query vector are the same as corresponding one or more bits of the at least one dimension of at least one reference vector;
using the control signal to control a pulse modifying circuit such that a modification applied to a pulse signal by the pulse modifying circuit is dependent upon whether the respective one or more bits of the at least one dimension of the query vector are the same as corresponding one or more bits of the at least one dimension of at least one reference vector; and determining a distance between the at least one query vector and the at least one reference vector based on modifications to the pulse signal applied by the pulse modifying circuit.

The means may be for:
comparing a plurality of dimensions of at least one query vector to a plurality of dimensions of a reference vectors;
obtaining a plurality of outputs; and
using the plurality of outputs to control the pulse modifying circuit so that a plurality of modifications are applied to a pulse signal.

The pulse modifying circuit may be configured to apply different magnitudes of modifications to the pulse signals corresponding to different bits of the dimensions of the vectors.

The pulse modifying circuit may be configured to apply the same magnitude of modifications to the pulse signals corresponding to different bits of the dimensions of the vectors.

A magnitude of the modifications applied to the pulse signals may control a pulse width of pulses within the pulse signal.

The means may be for passing a pulse signal through the pulse modifying circuit a plurality of times.

The pulse modifying circuit may comprise at least one of; a pulse shrinking circuit, a pulse stretching circuit.

The pulse modifying circuits may comprise:
a first inverter;
a second inverter; and
at least one transistor, wherein the transistor is connected to the outputs of the inverter so that a magnitude of a modification applied by the pulse modifying circuit is dependent upon a time taken for capacitors in the inverter to discharge through the transistor.

The pulse modifying circuit may comprise a transistor comprising a resistance such that a magnitude of a modification applied by the pulse modifying circuit is dependent upon the value of the resistance.

The pulse modifying circuit may comprise a first inverter and a second inverter and one or more resistors such that a magnitude of a modification applied by a pulse modifying circuit is dependent upon the number of invertors and resistors connected within a module of the pulse modifying circuit.

The means may be for:
comparing a plurality of bits of at least one query vector to a plurality of bits of a plurality of reference vectors;
obtaining a plurality of outputs; and
using the plurality of outputs to control a plurality of pulse modifying circuits.

The means may be for comparing the at least one bit of the at least one query vector to a corresponding at least one bit of at least one reference vector comprises one or more XOR logic circuits.

The distance between the query vector and the reference vector may comprise at least one of: a Hamming distance, and a Manhattan distance.

The apparatus may comprise circuitry for comparing modified pulse signals corresponding to different reference vectors in order to determine the reference vector with the shortest distance to the query vector.

The means may comprise in-memory computing circuits.

According to various, but not necessarily all, examples of the disclosure there may be provided a method comprising:
obtaining at least one dimension of at least one query vector wherein the dimension comprises one or more bits;
comparing respective one or more bits of the at least one dimension of the at least one query vector to corresponding one or more bits of at least one dimension of at least one reference vector to obtain a control signal dependent upon whether the respective one or more bits of the at least one dimension of the query vector are the same as corresponding one or more bits of the at least one dimension of at least one reference vector;
using the control signal to control a pulse modifying circuit such that a modification applied to a pulse signal by the pulse modifying circuit is dependent upon whether the respective one or more bits of the at least one dimension of the query vector are the same as corresponding one or more bits of the at least one dimension of at least one reference vector; and
determining a distance between the at least one query vector and the at least one reference vector based on modifications to the pulse signal applied by the pulse modifying circuit.

BRIEF DESCRIPTION

Some examples will now be described with reference to the accompanying drawings in which:
FIG. 1 shows an apparatus;
FIG. 2 shows an example system;
FIG. 3 shows an example distance measurement module;

DETAILED DESCRIPTION

In-memory computing (IMC) circuits can reduce latency and energy consumption by removing the need for data transfer between a memory and a processor. This also saves processing power. Examples of the disclosure relate to IMC circuits that can be used to determine distances between respective vectors. Such circuits can be used for machine learning applications. For example, they could be used to determine distances such as Hamming distances or Manhattan distances.

Figure 1:
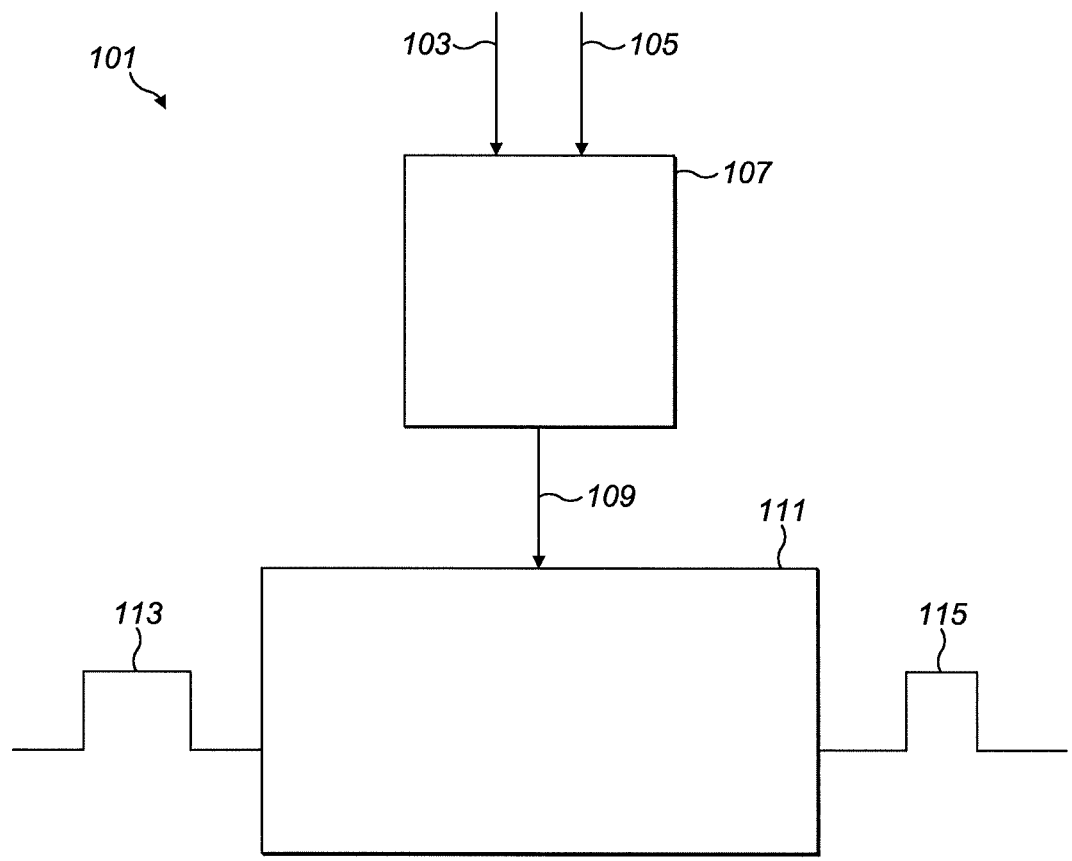

FIG. 1 schematically shows an apparatus 101 that can be used for determining the distance between vectors or dimensions of vectors. The dimensions provide different components of the vectors. The apparatus 101 can be implemented using IMC circuits and/or any other suitable type of circuitry or hardware.

The apparatus is configured to receive one or more dimensions of a query vector 103 and one or more dimensions of a reference vector 105. The apparatus 101 is configured so that the dimension of the query vector 103 and the dimension of the reference vector 105 are provided to a comparison module 107.

The respective dimensions of the reference vector 105 and the query vector 103 can comprise one or more bits. The dimensions of the reference vector 105 can comprise the same number of bits as the dimensions of the query vector 103 so that corresponding bits of the reference vector 105 can be compared to corresponding dimensions of the query vector 103.

The comparison module 107 can comprise any means that can be configured to compare the bits of the dimensions of the query vector 103 to the bits of the dimensions of the reference vector 105 and provide an output indicative of whether or not the bits of the dimensions of the query vector 103 are the same as the bits of the dimensions of the reference vector 105. In the example of FIG. 1 the comparison module 107 provides a control signal 109 as an output. The control signal 109 is dependent upon whether the bits of the dimensions of the query vector 103 are the same as the corresponding bits of the dimensions of the reference vector 105.

The control signal 109 is provided to a pulse modifying circuit 111. The pulse modifying circuit 111 can comprise any circuitry that can be configured to modify the pulses in an input pulse signal 113. The pulse modifying circuit 111 can be configured to modify the length of the pulses within the input pulse signal 113. In some examples the pulse modifying circuit 111 can be a pulse shrinking circuit. In some examples the pulse modifying circuit 111 can be a pulse stretching circuit.

The control signal 109 is used to control the pulse modifying circuit 111 such that the modifications applied to the input pulse signal 113 by the pulse modifying circuit 111 are dependent upon whether the bits of the query vector 103 are the same as the corresponding bits of the reference vector 105. This means that length of the pulses in the output pulse signal 115 are dependent upon whether or not the bit of the query vector 103 is the same as the corresponding bit of the reference vector 105. Therefore, a distance between the query vector 103 and the reference vector 115 can be determined based on modifications that are applied to the input pulse signal 113 applied by the pulse modifying circuit 115.

FIG. 1 shows one bit of a query vector 103 being compared to one bit of one reference vector 105. In examples of the disclosure a plurality of bits of the query vector 103 could be compared to a plurality of bits of a reference vectors 105. In such examples the apparatus 107 can comprise a plurality of comparison modules 107 configured to compare the respective bits. The outputs of the respective comparison modules 107 are used to control the pulse modifying circuit 111 so that a plurality of modifications are applied to the pulse signal.

In some examples the pulse modifying circuit 111 can be configured so modifications of the same magnitude can be applied to the input pulse signals 113 where the modifications relate to different bits of the vectors. In some examples the pulse modifying circuit 111 can be configured so that different magnitudes of modifications can be applied to the pulse signals where the different modifications correspond to the different bits of the vectors. The modifications control the pulse width of pulses within the input pulse signals 113. The different magnitudes of modifications can cause different sized changes in the pulse widths of the input pulse signals 113.

The pulse modifying circuit 111 can be configured so that the modifications resulting from the same reference vector 105 that are applied to the input pulse signal 113 are cumulative. For example, the modifications can be applied sequentially as the input pulse signal 113 passes through the pulse modifying circuit 111. The input pulse signal 113 can be circulated through the pulse modifying circuit 111 a plurality of times so as to increase the modifications applied to the input pulse signal 113.

The apparatus 101 can also be configured so that the same query vector 103 can be compared to a plurality of different reference vectors 105. The apparatus 101 can be configured for comparing a plurality of bits of at least one query vector 103 to a plurality of bits of a plurality of reference vectors 105 and obtaining a plurality of outputs 109 and using the plurality of outputs 109 to control a plurality of pulse modifying circuits 111. The outputs of the respective comparison modules 107 are used to control respective pulse modifying circuits 111. The respective pulse modifying circuits 111 relating to the comparisons to different reference vectors can be configured so that the modifications to the pulse signal resulting from the same reference vector are not cumulative. That is, pulse signals corresponding to different reference vectors 105 have different modifications applied to them. This enables the respective pulse lengths of the signals output by the respective pulse modifying circuits to be used to identify which of the reference vectors 105 is closest to the query vector 103.

Figure 2:
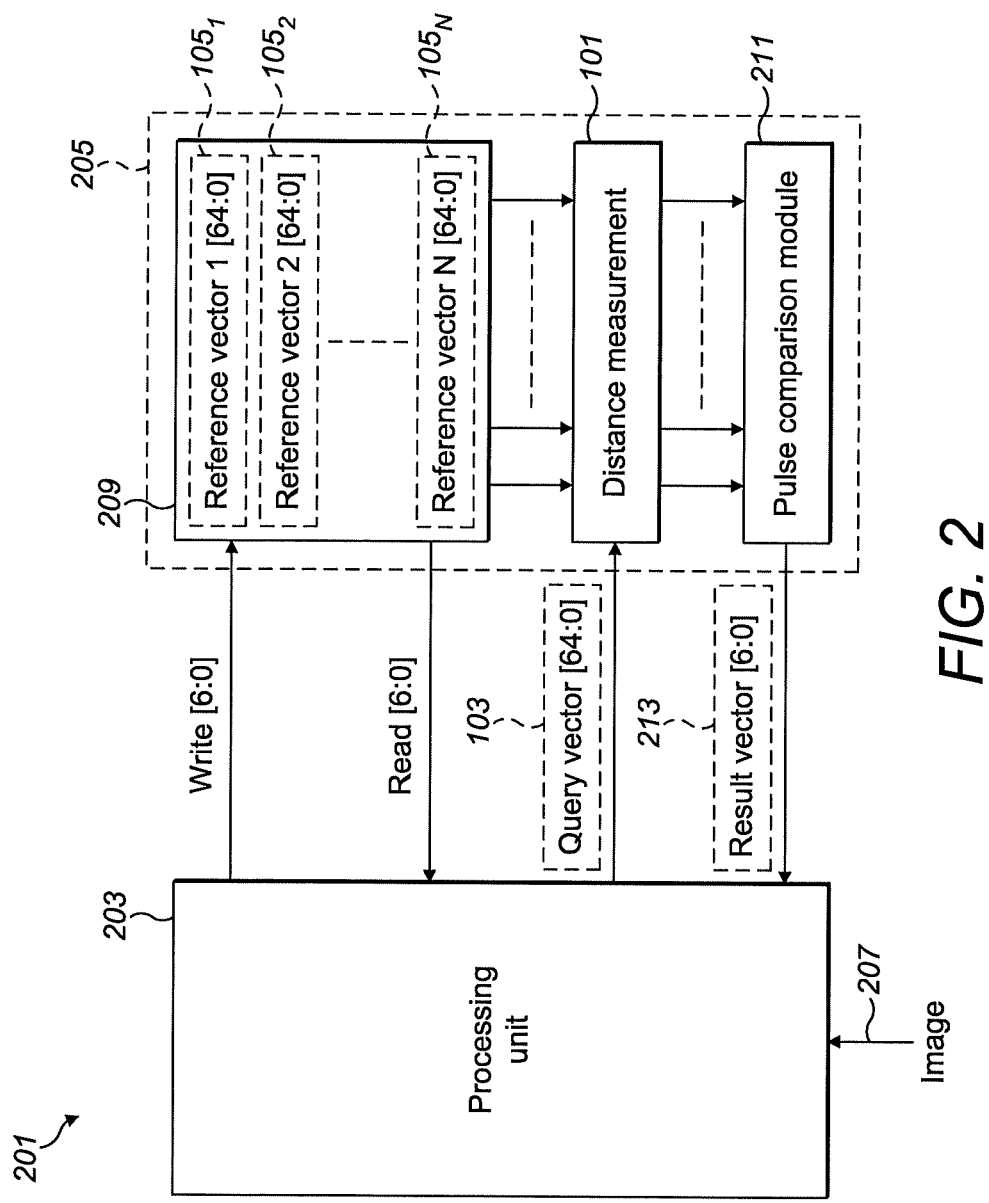

FIG. 2 schematically shows an example system 201 that can be used to implement examples of the disclosure. The system 201 comprises an IMC macro 205 and a processing unit 203. The system 201 could comprise additional modules or circuitry that are not shown in FIG. 2.

The processing unit 203 can be configured to implement machine learning applications. The machine learning application can comprise a neural network or any other suitable type of trainable model. The term "machine learning application" refers to any kind of artificial intelligence (AI), intelligent or other method that is trainable or tuneable using data. The machine learning application can be trained or configured to perform a task, such as identifying objects within an image, without being explicitly programmed to perform that task or starting from an initial configuration. The machine learning application can be configured to learn from experience E with respect to some class of tasks T and performance measure P if its performance at tasks in T, as measured by P, improves with experience E. In some examples the machine learning application can learn from previous outputs that were obtained for the same or similar inputs. Other types of machine learning applications could be used in other examples.

The machine learning application can be a memory augmented machine learning application in which some of the processing can be implemented using IMC circuitry. In the example of FIG. 2 the machine learning application could be a memory-augmented neural network (MANN). Other types of machine learning application could be used in other examples of the disclosure.

In the example of FIG. 2 the processing unit 203 receives image data 207 as an input. In this example the machine learning application can be configured to identify information such as objects within the image data 207. Machine learning applications that perform other tasks could be used in other examples.

The processing unit 203 is configured to convert the input image data 207 to a query vector 103. The query vector 103 can be in any suitable format. The query vector 103 can comprise a plurality of dimensions. The respective dimensions can comprise one or more bits. The processing unit 203 is configured to provide the query vector 103 to the IMC macro 205 to enable the IMC macro to determine a distance between the query vector and one or more reference vectors 105.

The IMC macro 205 comprises storage means 209 for storing a plurality of reference vectors 105. In the example of FIG. 2 the system 201 comprises N reference vectors 105. The respective reference vectors comprise a plurality of dimensions. The respective dimensions comprise a plurality of bits. The system 201 is configured so that the processing unit 203 can write to and read from the storage means 209.

The IMC macro 205 also comprises a distance measurement module. The distance measurement module could be an apparatus 101 as shown in FIG. 1 or any other suitable means.

The query vector 103 comprises a plurality of dimensions. The respective dimensions comprise a plurality of bits. The distance measurement module is configured to receive the query vector 103, or dimensions of the query vector 103 as a first input. The distance measurement module is configured to receive one or more reference vectors 105, or dimensions of reference vectors 105 as a second input. The distance measurement module is configured to compare the query vector 103 with the reference vector 105 and use the outputs of that comparison as a control signal for a pulse modifying circuit 111. The distance measurement module can therefore provide a pulse signal as an output where the length of pulses within the signal is indicative of the distance between the query vector 103 and the respective reference vectors 105. The duration of the pulses in the signal output by the pulse modifying circuit are dependent upon the result of the comparison of the query vector to the respective reference vectors.

The IMC macro 205 also comprises a pulse comparison module 211. The pulse comparison module 211 is configured to receive a plurality of pulse signals from the distance measurement module. The pulse comparison module 211 comprises means, such as circuitry, for comparing modified pulse signals corresponding to comparisons of the query vector to different reference vectors. The pulse comparison module 211 can be configured to find the pulse signal with the shortest pulse length or the longest pulse length as appropriate. The pulse signal with the shortest pulse length or the longest pulse length can indicate which reference vector 105 has the shortest distance to the query vector 103.

The pulse comparison module 211 can comprise winner takes all circuitry or any other suitable means.

The pulse comparison module 211 provides a result vector 213 as an output. The result vector 213 can indicate which of the reference vectors has the shortest distance to the query vector 103. In some examples the result vector 213 can be a class label which indicates a class to which the query vector has been determined to belong, the distance value or any other suitable information or combination of information. The processing unit can use the result vector 213 to classify the image data 207 and/or to perform any other suitable task.

Figure 3:
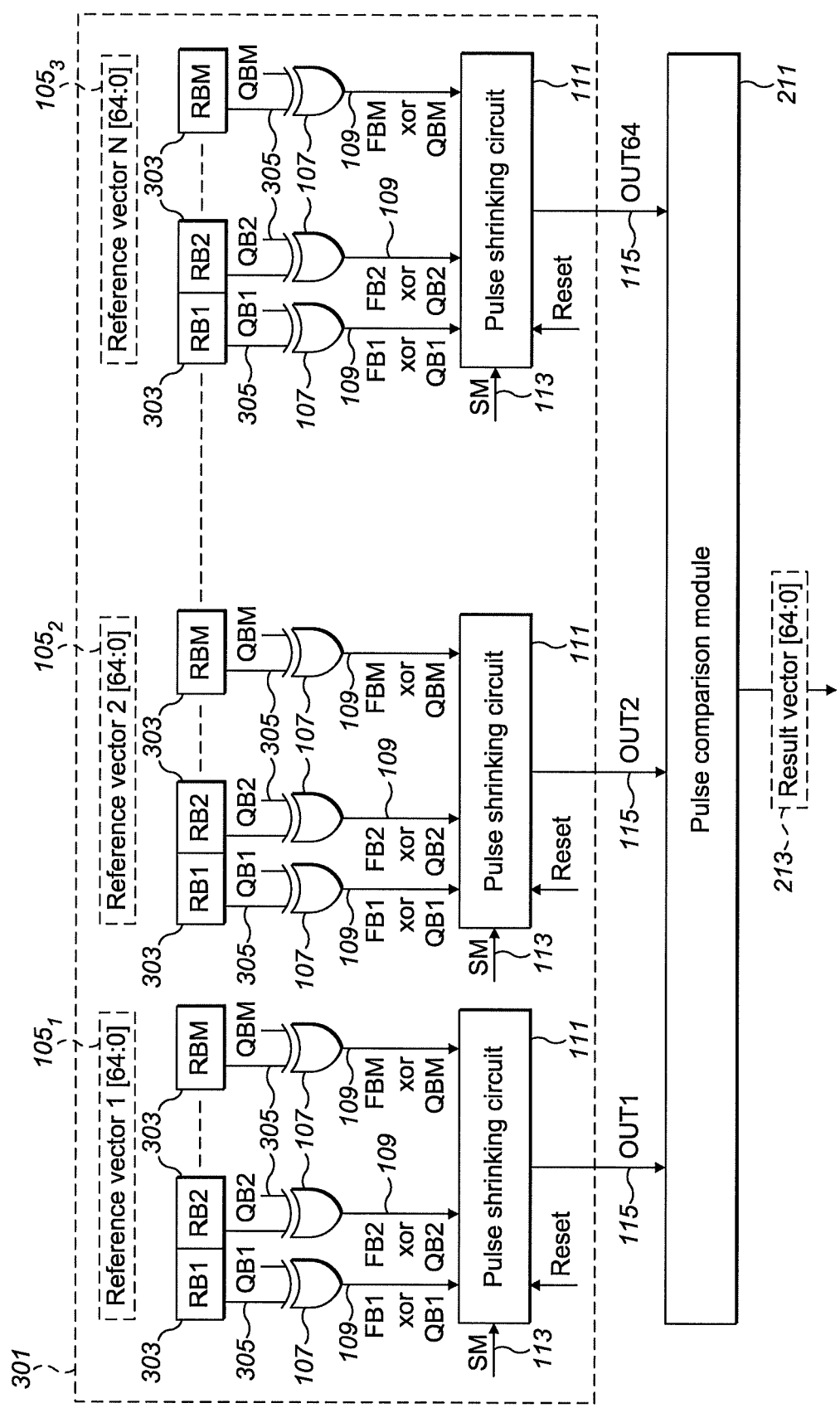

FIG. 3 shows an example distance measurement module 301. The distance measurement module 301 could be provided by an apparatus 101 such as the apparatus 101 of FIG. 1.

The distance measurement module 301 receives N reference vectors 105 as inputs. Each reference vector 105 comprises a plurality of dimensions. Each dimension is comprised of a plurality of bits. The respective reference vectors 105 can be divided into a plurality of dimensions. Each dimension can comprise one or more bits. In the example of FIG. 3 each of the N reference vectors 105 are divided into the same number of dimensions. Each of the N reference vectors 105 is divided into D dimensions.

In some examples each of the dimensions can comprise the same number of bits. In this example each of the D dimensions comprises M bits 303. As an example, if the reference vector 105 comprises 64 bits then D*M=64.

The query vector 103 is also divided into a corresponding number of dimensions. The query vector 103 can be divided into dimensions so that particular bits 303 of the dimensions of the reference vectors 105 can be compared to corresponding bits of the dimensions of the query vector 103. In the example of FIG. 3 the query vector is also divided into M dimensions where each dimension comprises D bits 305. This enables the respective bits 305 of the query vector 103 to be compared to the respective bits 303 of the reference vectors 105.

The same query vector 103 is compared to a plurality of different reference vectors 105 so that the reference vector 105 that is closest to the query vector 103 can be determined.

The respective bits 303 of the reference vectors 105 are provided as a first input to a comparison module 107 and a corresponding bit 305 of the query vector 103 is provided as a second input to the same comparison module 107. This enables the corresponding bits of the reference vectors 105 and the query vectors 103 to be compared.

In the example of FIG. 3 the comparison module 107 comprises an XOR logic circuit. The XOR block provides an output signal that is dependent upon any differences between the first input and the second input. Therefore, in this case the outputs of the XOR block are dependent upon the difference between the bits of the reference vector and the bits of the query vector. The output of the XOR logic circuit is high when the first input and second input are different to each other. Therefore, the outputs of the XOR logic circuits as shown in FIG. 3 are high if the respective bits 303, 305 are different to each other and low if they are the same. Other types of comparison module 107 could be used in other examples of the disclosure.

In the example of FIG. 3 the distance measurement module 301 comprises a plurality of comparison modules 107. This enables a plurality of bits 305 of a query vector 103 to be compared to a plurality of bits 303 of a plurality of reference vectors 105. In the example of FIG. 3 each comparison module 107 is configured to compare different a different bit 303 of a reference vector 105 to a corresponding bit 303 of a query vector 103.

Each of the comparison modules 107 provides an output signal 109 to a pulse modifying circuit 111. In the example of FIG. 3 a plurality of pulse modifying circuits 111 are shown. In this example a pulse modifying circuit is provided for each reference vector 105. In other examples a single pulse modifying circuit 111 could be used for a plurality of reference vectors 105.

In this example the pulse modifying circuit 111 is a pulse shrinking circuit. The pulse shrinking circuit can comprise any circuitry that can be configured to decrease the length of pulses in an input pulse signal 113. In other example the pulse modifying circuit 111 could be pulse stretching circuit. The pulse stretching circuit could comprise any circuitry that can be configured to increase the length of pulses in an input pulse signal 113.

The output signal 109 controls the pulse modifying circuit 111 so that the modification applied to the input pulse signal 113 is dependent upon whether or not there is a difference between the bit of the reference vector and the bit of the query vector 103.

For instance, in the example of FIG. 3 the pulse modifying circuit 111 is a pulse shrinking circuit. The pulse modifying circuit 111 can be configured so that if the control signal 109 indicates that the bit 303 of the reference vector 105 is the same as the bit 305 of the query vector 103 then a modification is applied to the pulse. In this example the pulse shrinking circuit would shrink the pulses. Conversely, if the control signal 109 indicates that the bit 303 of the reference vector 105 is not the same as the bit 305 of the query vector 103 then a modification is not applied to the pulses in the input pulse signal 113. This means that the more bits of the reference vector 105 that are the same as the query vector, the more modifications are applied by the pulse modifying circuit. In the example of FIG. 3 this would result in more shrinking of the pulses.

The output signals 115 of the pulse modifying circuits 111 are provided to a pulse comparison module 211. The pulse comparison module can be configured to compare the pulse length of the respective output signals from the respective pulse modifying circuits 111. In this example the pulse modifying circuits are pulse shrinking circuits and the signal with the shortest pulse length will correspond to the reference vector that has the shortest distance to the query vector 103. If the pulse modifying circuits were pulse stretching circuits then the signal with the longest pulse length would correspond to the reference vector that has the shortest distance to the query vector 103.

The pulse comparison module 211 provides a result vector 213 as an output. The result vector 213 can indicate which of the reference vectors has the shortest distance to the query vector 103.

Figure 4A:
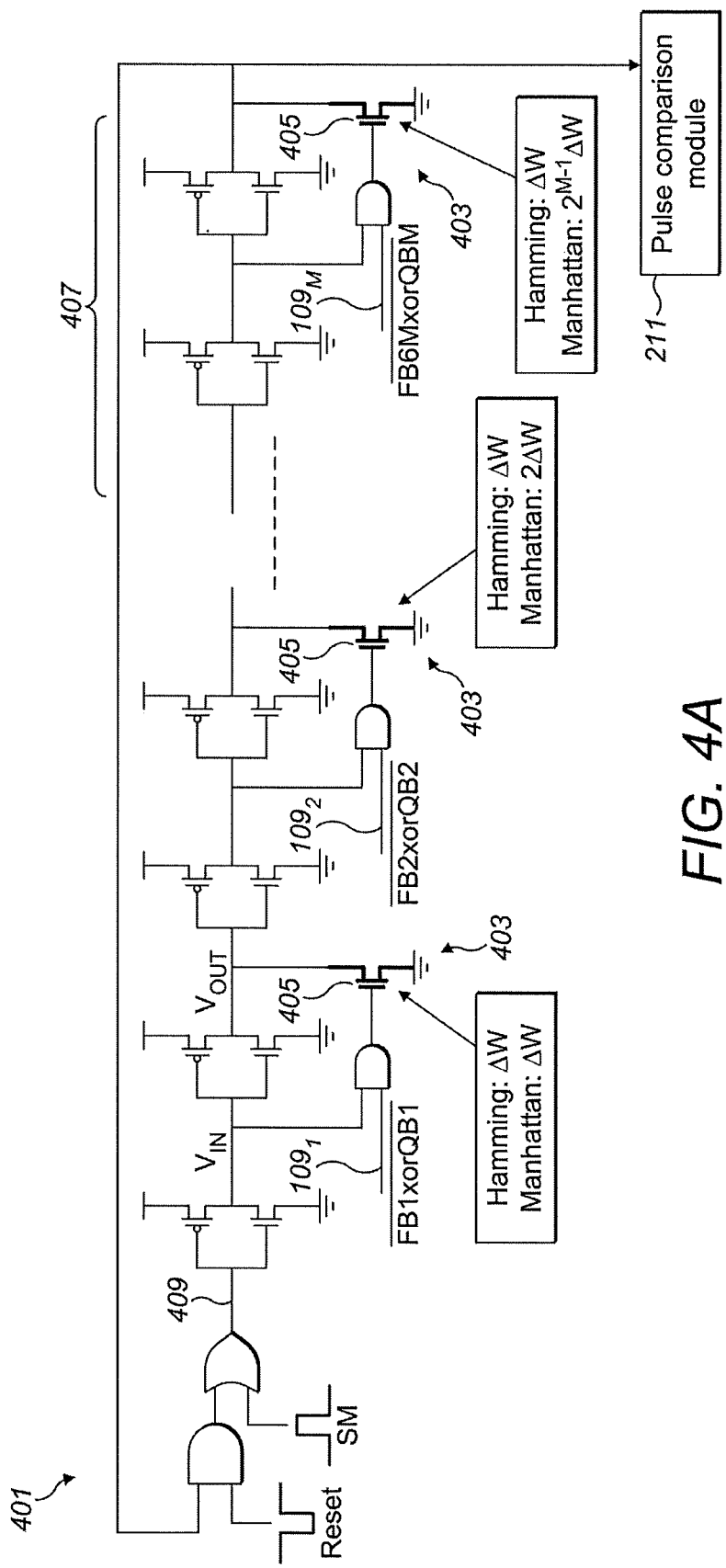
FIGS. 4A and 4B show an example pulse shrinking circuit.

FIG. 4A shows an example pulse shrinking circuit 401 that could be used in some examples of the disclosure.

The pulse shrinking circuit 401 comprises a delay line 409 comprising a plurality of modules 407. The pulse shrinking circuit 401 is configured so that a pulse signal can be provided to the delay line 409.

In the example of FIG. 4A three modules 407 are shown. The pulse shrinking circuit 401 can comprise any suitable number of modules 407. The number of modules 407 can correspond to the number of bits of the reference vectors 105 and the query vectors 103. If the pulse shrinking circuit 401 is to be used to determine a Hamming distance then the number of modules 407 can be the same as the number of bits of the reference vectors 105. If the pulse shrinking circuit 401 is to be used to determine a Manhattan distance then the number of modules 407 can be the same as, or higher than, the number of bits of the reference vectors 105.

The modules 407 are connected in series so that a pulse signal passes through the respective modules 407 in sequence. The total modification made to a pulse signal as it passes through the delay line 409 is the cumulative modification applied by each of the different modules 407.

The respective modules 407 are connected to respective comparison modules 107 (not shown in FIG. 4A) so that different modules 407 receive different control signals 109. This enables the different modules 407 to apply different modifications to a pulse signal based on the comparison of different bits of the same query vector 103 and reference vector 105.

The respective modules 407 comprise a pulse shrinking inverter 403 and a variable transistor 405. In the example of FIG. 4A the modules comprise two invertors so that the inversion of the signal by the pulse shrinking inverter 403 is counteracted by the other inverter. The pulse shrinking inverter 403 and the other inverter provide a first inverter and a second inverter.

The variable transistors 405 can be any suitable type of transistors. In some examples the variable transistors 405 can comprise field effect transistors such as Metal-Oxide semiconductor FETs (MOSFETs) or any other suitable type of transistors. The resistance of the FET can be controlled by controlling the resistance of the conducting channel.

The respective variable transistors 405 are connected to the outputs of a respective inverter 403 so that the rise time t_pLH for the pulse shrinking inverter 403 is different to the fall time t_pHL. This leads to a pulse shrinking given by:

$$\Delta W = t\_pHL - t\_pLH$$

The magnitude of a modification applied by the module 407 of the pulse modifying circuit 111 is dependent upon the difference in the respective rise time and fall time.

The difference in rise time and fall time is dependent upon the resistance of the variable transistor 405. Therefore, by using the control signals 109 to control the resistance of the variable transistor 405 the size of the pulse shrinking applied by the respective modules 407 of the pulse modifying circuit 111 can be controlled.

In the example of FIG. 4A the variable transistor 405 is connected in parallel with a transistor of the invertor 403. Other configurations could be used in other examples of the disclosure.

As shown in FIG. 4A different modifications can be applied to the pulse signal dependent upon the type of distance that is to be calculated. For instance, if the distance to be calculated is the Hamming distance then a modification of the same magnitude is applied by each of the modules 407 of the pulse modifying circuit 111. In such cases the modification applied by each module is given by $\Delta W$.

If the distance to be calculated is the Manhattan distance then modifications of different magnitudes are applied by different modules 407 of the pulse modifying circuit 111. The modification applied by the respective modules can be given by $2^{M-1}\Delta W$ where M indicates the significance of the bit of the vector.

Different configurations of the pulse modifying circuit 111 can be used in order to enable different magnitudes of modification to be applied by the different modules 407 of the pulse modifying circuit 111. For example, in some implementations transistors 405 with different resistance values could be used in different modules 407 of the pulse modifying circuit 111. In some examples different modules 407 of the pulse modifying circuit 111 could comprise different numbers of pulse shrinking inverters 403 and transistors 405 so that increased modifications could be obtained by having a larger number of pulse shrinking inverters 403 and transistors 405 within a module 107.

Figure 4B:
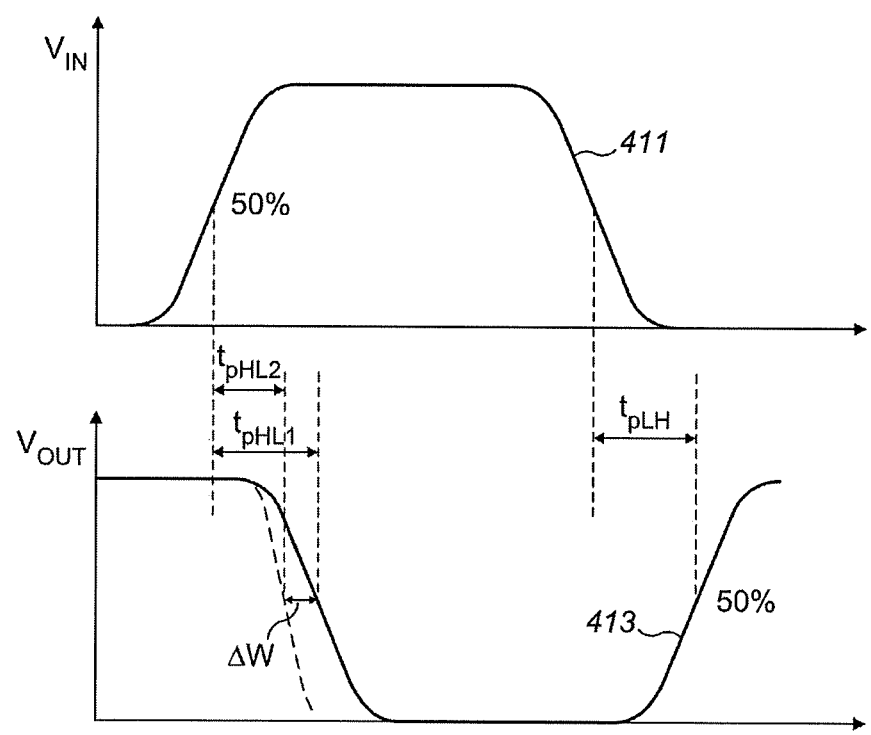

FIG. 4B shows an example of the pulse shrink value that could be applied by a module 107 of the pulse modifying circuit 111.

FIG. 4B shows an example input pulse 411 and the corresponding output pulse 413 for a pulse shrinking invertor 403 in the pulse modifying circuit 111. The rise time t_pLH for the pulse shrinking inverter 403 is different to the fall time t_pHL due to the resistance of the variable transistor 405.

As an illustrative example, if a bit 303 of a reference vector 105 and a bit 305 of the query vector 103 are the same then the output of the comparison module 107 will be 0. This is used to control the variable transistor 405 to have a low resistance. The low resistance can be achieved by increasing the conductivity of the channel of the transistors 405. This will result in a shorter inverter fall time t_pHL and so the pulse will be shrank as it passes through the invertor 403.

The more bits of the reference vector 403 and the query vector 103 that are the same, the more modules 407 of the pulse modifying circuit will shrink the pulses. This will lead to shorter pulses for the reference vectors that are most similar to the query vectors 103.

Figure 5:
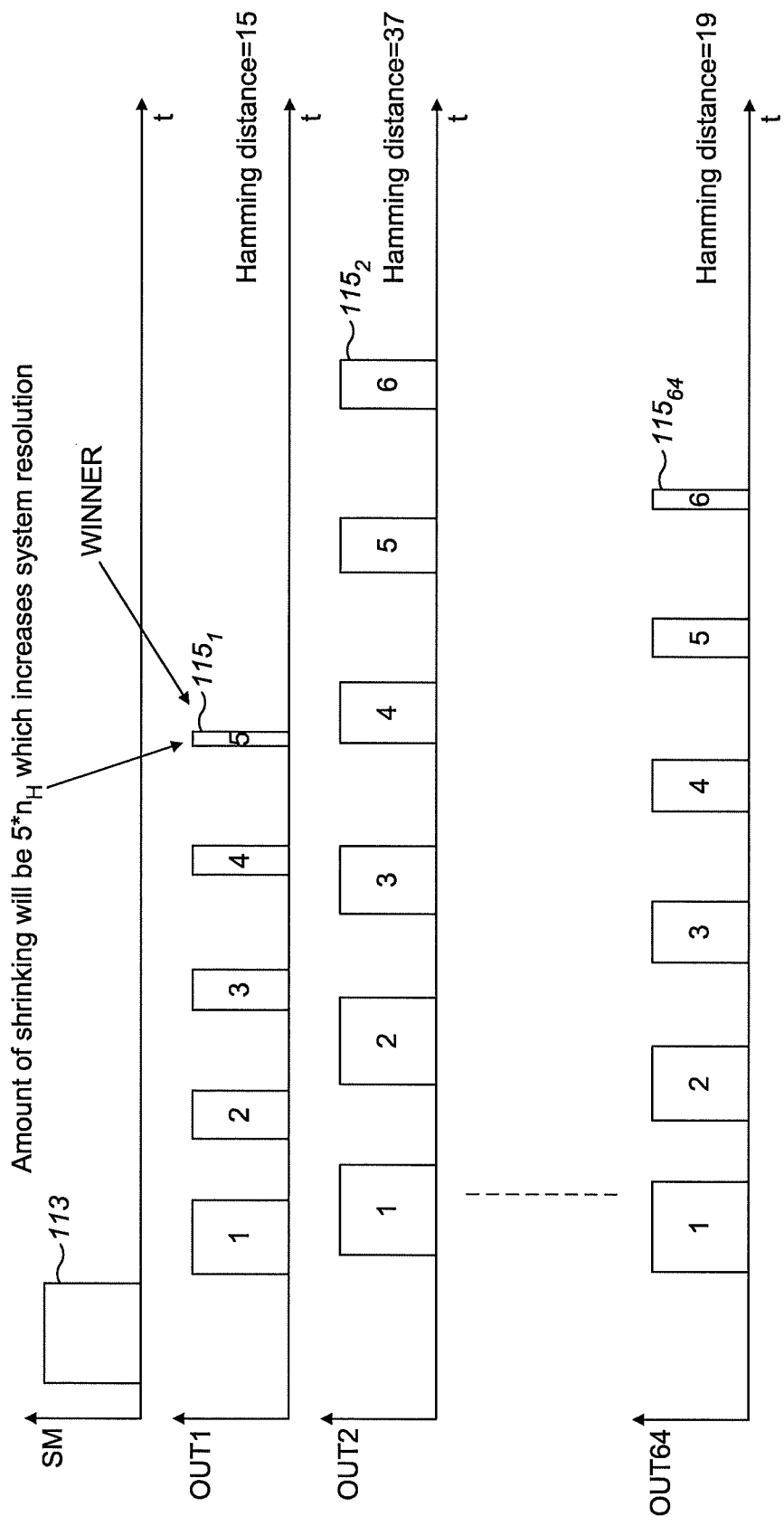
FIG. 5 shows example output signals.

FIG. 5 shows example output signals 115 for respective pulse shrinking circuits 401. The example output signals could be obtained using pulse shrinking circuits 401 such as the example shown in FIG. 4A, or by using any other suitable arrangement of circuitry. The pulse shrinking circuit 401 has been configured to measure the Hamming distance $n_H$. Other distances could be measured in other examples.

FIG. 5 shows an input pulse signal 113. The input pulse signal 113 comprises a pulse. In this example the input pulse signal 113 comprises a square pulse. Other types of input signals could be used in other examples.

FIG. 5 also shows three different output signals $115_1$, $115_2$, $115_{64}$. In other examples other numbers of output signals 115 can be obtained.

The different output signals $115_1$, $115_2$, $115_{64}$ correspond to the different reference vectors $105_1$, $105_2$, $105_{64}$. The respective output signals $115_1$, $115_2$, $115_{64}$ are obtained by comparing different reference vectors $105_1$, $105_2$, $105_{64}$ to the same query vector 103 and modifying the input pulse signal 113 based on the results of the comparison.

In the example of FIG. 5 the respective signals can be passed through the pulse shrinking circuit 401 a plurality of times. For instance, the output signal can be looped back to the input of the pulse shrinking circuit 401 one or more times. This causes the shrinking to be applied to the signal a plurality of times. For instance, if the signals are passed though the pulse modifying circuit 111 five times this shrinks the pulse by an amount 5*n_H where n_H is a Hamming distance. This increases the resolution of the comparison of the respective output signals 115.

In the example of FIG. 5 the first output signal $115_1$ has been passed through the pulse shrinking circuit 401 five times. Each of the other output signals $115_2$, $115_{64}$ have also been passed through passed through the pulse shrinking circuit 401 at least five times so that the respective output signals $115_1$, $115_2$, $115_{64}$ can be compared.

The sizes of the pulses in the output signals 115 are dependent on the Hamming distance so that the shorter the Hamming distance the shorter the pulse. In this example the first reference vector $105_1$ has a Hamming distance of 15, the second reference vector $105_2$ has a Hamming distance of 37 and the third reference vector $105_{64}$ has a Hamming distance of 19. This is shown in FIG. 5 because the first output signal $115_1$ has the shortest pulse and the second output signal $115_2$ has the longest pulse.

A pulse comparison module 211 can be used to determine the reference vector 105 with the shortest distance to the query vector 103 by comparing the pulses in the respective output signals 115. In some examples the pulse comparison module 211 can comprise winner takes all circuitry or any other suitable type of circuitry.

In examples where the pulse modifying circuit 111 is a pulse shrinking circuit 401 the pulse comparison module 211 can be configured to find the output signal 115 with the shortest pulse. In some examples the pulse comparison module 211 can be configured to detect which pulse in the respective output signals 115 disappears first. In the example FIG. 5 this would be the first output signal $115_1$ which represents the comparison of a first reference vectors $105_1$ with the query vector 103.

In some examples the distance could be determined by examining a pulse duration in the output signals 115. For example, after the signal has been passed through the pulse modifying circuit 111 a plurality of times the duration of the pulses in the respective output signals 115 can be analyzed.

In examples where the pulse modifying circuit 111 is a pulse stretching circuit the pulse comparison module 211 can be configured to find the output signal 115 with the longest pulse.

Figure 6:
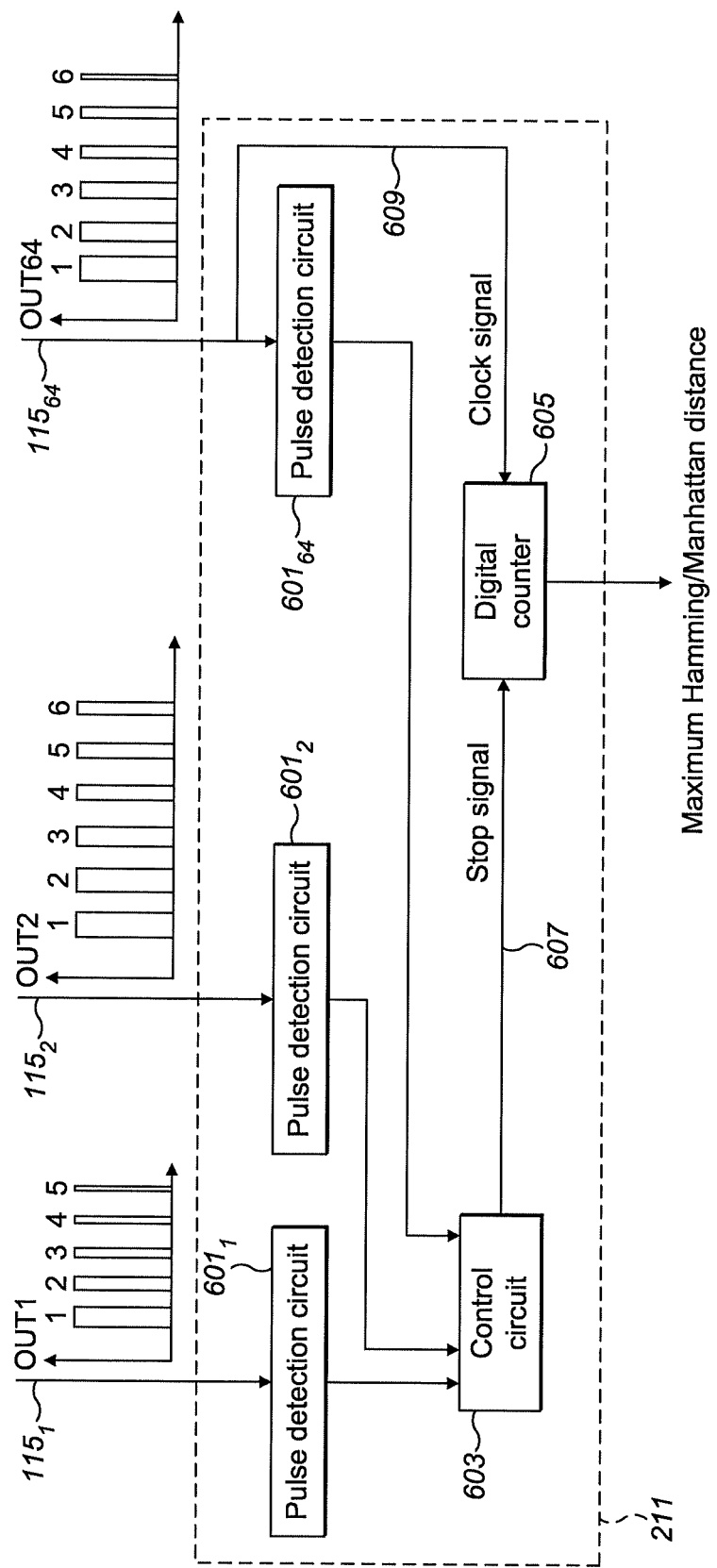
FIG. 6 shows a pulse comparison module.

FIG. 6 schematically shows an example pulse comparison module 211. The pulse comparison module 211 could be configured to detect the output signal representing the shortest Hamming distance. In this example the pulse comparison module 211 is configured to detect which pulse in the respective output signals 115 disappears first.

The pulse comparison module 211 is configured to receive a plurality of output signals 115. The output signals 115 can be output signals 115 such as the output signals 115 from a pulse shrinking circuit as shown in FIG. 5 or any other suitable type of output signals.

The pulse comparison module 211 comprises a plurality of pulse detection circuits 601, a control circuit 603 and a digital counter 605.

The pulse detection circuits 601 can comprise any circuits that are configured to detect the disappearance of a pulse. In the example of FIG. 6 the pulse comparison module 211 comprises a plurality of pulse detection circuits 601. In the example of FIG. 6 a respective pulse detection circuit 601 is provided for the respective output signals 115. Each output signal 115 is provided to a different pulse detection circuit 601.

The plurality of pulse detection circuits 601 are configured to provide signals to the control circuit 603. In the example of FIG. 6 the pulse comparison module 211 is configured so that a plurality of different pulse detection circuits 601 provide signals to the same control circuit 603.

When one of the signals from a pulse detection circuit 601 indicates that a pulse has disappeared. The control circuit 603 generates the stop signal 607. The stop signal 607 is sent from the control circuit 603 to the digital counter 605 to stop the digital counter.

The pulse comparison module 211 is configured so that the digital counter 605 also receives a clock signal 609. The clock signal 609 could be obtained from any of the output signals 115. In the example of FIG. 6 the out signal $115_{64}$ is used as the clock signal 609.

Figure 7:
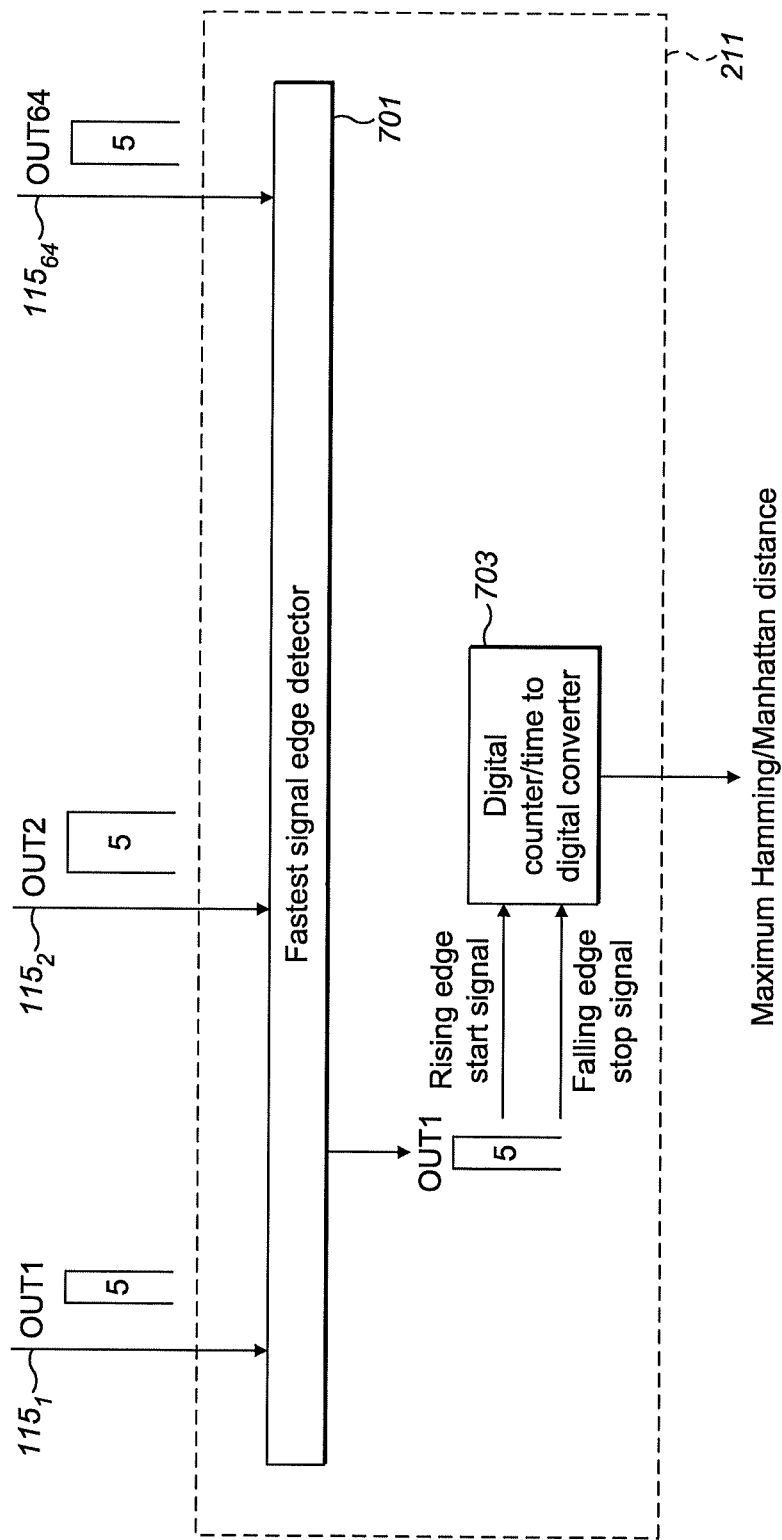
FIG. 7 shows a pulse comparison module.

FIG. 7 schematically shows another example pulse comparison module 211. This pulse comparison module 211 could also be configured to detect the output signal representing the shortest Hamming distance. In this example the pulse comparison module 211 is configured to examine the pulse durations of the output signals 115.

The pulse comparison module 211 is configured to receive a plurality of output signals 115. The output signals 115 can be output signals 115 such as the output signals 115 from a pulse shrinking circuit 401 shown in FIG. 5 or any other suitable type of output signals.

In the example of FIG. 7 the pulse comparison module 211 comprises a fastest signal edge detector 701 and digital counter 703.

The fastest signal edge detector 701 can comprise any circuitry that can be configured to detect the pulse that arrives first at the pulse comparison module 211. In the example of FIG. 7 the output signals 115 are provided to the same fastest signal edge detector 701.

The Hamming distance or Manhattan distance can be obtained by using the rising edge of the pulse to start a digital counter 703 and the falling edge to stop the digital counter 703. In some examples time-to-digital converters could be used instead of digital counters.

The output of the pulse comparison module 211 is therefore an indication of the minimum Hamming or Manhattan distance.

Therefore examples of the disclosure provide an apparatus 101 that makes use of IMC circuits to enable vector distances to be determined. This can enable more efficient machine learning applications to be provided by a system because it reduces latency within the system.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one." or by using "consisting".

In this description, reference has been made to various examples. The description of features or functions in relation to an example indicates that those features or functions 35 are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

I claim:

1. An apparatus, comprising:
    at least one processor; and
    at least one memory storing instructions that, when executed with the at least one processor, cause the apparatus to perform:
    obtaining at least one dimension of a query vector wherein the dimension comprises one or more bits;
    comparing respective one or more bits of the at least one dimension of the query vector to corresponding one or more bits of at least one dimension of a reference vector to obtain a control signal dependent upon whether the respective one or more bits of the at least one dimension of the query vector are the same as corresponding one or more bits of the at least one dimension of the reference vector;
    using the control signal to control a pulse modifying circuit such that a modification applied to an input pulse signal to form an output pulse signal with the pulse modifying circuit is dependent upon whether the respective one or more bits of the at least one dimension of the query vector are the same as corresponding one or more bits of the at least one dimension of the reference vector; and determining, using the output pulse signal, a distance between the query vector and the reference vector based on modifications to the input pulse signal applied with the pulse modifying circuit that forms the output pulse signal.

2. An apparatus as claimed in claim 1 wherein the instructions, when executed with the at least one processor, cause the apparatus to perform:

comparing a plurality of dimensions of the query vector to a plurality of dimensions of the reference vector to obtain a corresponding plurality of control signals; and using the plurality of control signals to control the pulse modifying circuit so that a plurality of modifications are applied to the input pulse signal to form the output pulse signal.

3. An apparatus as claimed in claim 1 wherein the instructions, when executed with the at least one processor, cause the apparatus to apply different magnitudes of modifications to the input pulse signal corresponding to different bits of the dimensions of the query and reference vectors.

4. An apparatus as claimed in claim 1 wherein the instructions, when executed with the at least one processor, cause the apparatus to apply a same magnitude of modifications to the input pulse signal corresponding to different bits of the dimensions of the query and reference vectors.

5. An apparatus as claimed in claim 3 wherein the instructions, when executed with the at least one processor, cause the apparatus to cause a magnitude of the modifications applied to the input pulse signal to control a pulse width of pulses that result in the output pulse signal.

6. An apparatus as claimed in claim 1 wherein the instructions, when executed with the at least one processor, cause the apparatus to pass a pulse signal, initially formed using the input pulse signal, through the pulse modifying circuit a plurality of times to form the output pulse signal.

7. An apparatus as claimed in claim 1 wherein the pulse modifying circuit comprises at least one of a pulse shrinking circuit or a pulse stretching circuit.

8. An apparatus as claimed in claim 1 wherein the pulse modifying circuit comprises a transistor comprising a resistance such that a magnitude of a modification applied with the pulse modifying circuit is dependent upon a value of the resistance.

9. An apparatus as claimed in claim 1 wherein the pulse modifying circuit comprises a first inverter and a second inverter and one or more resistors such that a magnitude of a modification applied with a pulse modifying circuit is dependent upon a number of inverters and resistors connected within a module of the pulse modifying circuit.

10. An apparatus as claimed in claim 1 wherein the instructions, when executed with the at least one processor, cause the apparatus to perform:

comparing a plurality of bits of the query vector to a plurality of bits of a plurality of corresponding reference vectors to obtain a plurality of individual control signals for individual ones of the plurality of corresponding reference vectors;

using the plurality of individual control signals to control a plurality of pulse modifying circuits to form a plurality of output pulse signals; and determining a plurality of individual distances based on the plurality of output pulse signals; and producing a result, indicating a reference vector having a shortest distance between the reference vector and the query vector, based on comparison of the plurality of individual distances.

11. An apparatus as claimed in claim 1 wherein the instructions, when executed with the at least one processor, cause the apparatus to compare at least one bit of the query vector to a corresponding at least one bit of the reference vector using one or more XOR logic circuits.

12. An apparatus as claimed in claim 1 wherein the instructions, when executed with the at least one processor, cause the apparatus to compare modified pulse signals corresponding to different reference vectors in order to determine the reference vector of the different reference vectors with a shortest distance to the query vector.

13. An apparatus as claimed in claim 1 wherein the at least one processor and the at least one memory comprises in-memory computing circuits.

14. A method, comprising:

obtaining at least one dimension of a query vector wherein the dimension comprises one or more bits;

comparing respective one or more bits of the at least one dimension of the query vector to corresponding one or more bits of at least one dimension of a reference vector to obtain a control signal dependent upon whether the respective one or more bits of the at least one dimension of the query vector are the same as corresponding one or more bits of the at least one dimension of the reference vector;

using the control signal to control a pulse modifying circuit such that a modification applied to an input pulse signal to form an output pulse signal with the pulse modifying circuit is dependent upon whether the respective one or more bits of the at least one dimension of the query vector are the same as corresponding one or more bits of the at least one dimension of the reference vector; and determining, using the output pulse signal, a distance between the query vector and the reference vector based on modifications to the pulse signal applied with the pulse modifying circuit.

15. A non-transitory program storage device readable with an apparatus tangibly embodying a program of instructions executable with the apparatus to cause the apparatus to perform at least the following:

obtaining at least one dimension of a query vector wherein the dimension comprises one or more bits;

comparing respective one or more bits of the at least one dimension of the query vector to corresponding one or more bits of at least one dimension of a reference vector to obtain a control signal dependent upon whether the respective one or more bits of the at least one dimension of the query vector are the same as corresponding one or more bits of the at least one dimension of the reference vector;

using the control signal to control a pulse modifying circuit such that a modification applied to an input pulse signal to form an output pulse signal with the pulse modifying circuit is dependent upon whether the respective one or more bits of the at least one dimension of the query vector are the same as corresponding one or more bits of the at least one dimension of the reference vector; and determining, using the output pulse signal, a distance between the query vector and the reference vector based on modifications to the input pulse signal applied with the pulse modifying circuit that forms the output pulse signal.

16. A method as claimed in claim 12 further comprising:

comparing a plurality of dimensions of the query vector to a plurality of dimensions of the reference vector to obtain a corresponding plurality of control signals; and using the plurality of control signals to control the pulse modifying circuit so that a plurality of modifications are applied to the input pulse signal to form the output pulse signal.

17. A method as claimed in claim 12 further comprising: passing a pulse signal, initially formed using the input pulse signal, through the pulse modifying circuit a plurality of times to form the output pulse signal.

18. A method as claimed in claim 12 wherein the pulse modifying circuit comprises at least one of a pulse shrinking circuit or a pulse stretching circuit.

19. A method as claimed in claim 12 further comprising:

comparing a plurality of bits of the query vector to a plurality of bits of a plurality of corresponding reference vectors to obtain a plurality of individual control signals for individual ones of the plurality of corresponding reference vectors;

using the plurality of individual control signals to control a plurality of pulse modifying circuits to form a plurality of output pulse signals; and determining a plurality of individual distances based on the plurality of output pulse signals; and producing a result, indicating a reference vector having a shortest distance between the reference vector and the query vector, based on comparison of the plurality of individual distances.

20. A method as claimed in claim 12 further comprising: comparing modified pulse signals corresponding to different reference vectors in order to determine the reference vector of the different reference vectors with a shortest distance to the query vector.

* * * * *